(12) United States Patent
Matsushita

(10) Patent No.: US 8,934,996 B2
(45) Date of Patent: Jan. 13, 2015

(54) TRANSMISSION APPARATUS AND TRANSMISSION METHOD

(75) Inventor: Akihiro Matsushita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 825 days.

(21) Appl. No.: 12/642,694

(22) Filed: Dec. 18, 2009

(65) Prior Publication Data

US 2010/0185307 A1   Jul. 22, 2010

(30) Foreign Application Priority Data

Jan. 21, 2009   (JP) ................. 2009-011118

(51) Int. Cl.
*G06F 17/00* (2006.01)
*H03G 3/30* (2006.01)

(52) U.S. Cl.
CPC .................. *H03G 3/3089* (2013.01)
USPC ....................................................... 700/94

(58) Field of Classification Search
USPC ................ 700/94; 381/58, 119, 94.1–94.9, 381/98–109
See application file for complete search history.

(56) References Cited

U.S. PATENT DOCUMENTS

| | | | |
|---|---|---|---|
| 6,466,833 B1 * | 10/2002 | Lau .................................. | 700/94 |
| 2006/0064187 A1 * | 3/2006 | Nishikori et al. ............... | 700/94 |
| 2009/0074206 A1 * | 3/2009 | Bradford et al. .............. | 381/103 |
| 2009/0323987 A1 * | 12/2009 | Yang et al. ..................... | 381/109 |

FOREIGN PATENT DOCUMENTS

JP   11-122169   4/1999

OTHER PUBLICATIONS

Yamaha Digital Mixing Engine DME32 Owner's Manual; copyright 2000.*
Specification of the Digital Audio Interface (The AES/EBU interface) Tech. 3250-E Third edition; copyright 2004.*

* cited by examiner

*Primary Examiner* — Andrew C Flanders
(74) *Attorney, Agent, or Firm* — Fitzpatrick, Cella, Harper & Scinto

(57) ABSTRACT

An audio signal processing unit acquires the playback volume value of audio data of a frame of interest, and generates multiplied audio data by multiplying the audio data of the frame of interest by the playback volume value. An S/PDIF transmission unit transmits the audio data of the frame of interest and the multiplied audio data as the transmission data of the frame of interest.

3 Claims, 4 Drawing Sheets

FIG. 2

| R CHANNEL | R CHANNEL AUDIO DATA | R CHANNEL AUDIO DATA ×VOLUME VALUE | R CHANNEL AUDIO DATA | R CHANNEL AUDIO DATA ×VOLUME VALUE | •••• |
|---|---|---|---|---|---|
| | SUBFRAME 1 | SUBFRAME 2 | SUBFRAME 1 | SUBFRAME 2 | |
| | FRAME N | | FRAME N+1 | | |

FIG. 3

| L CHANNEL | L CHANNEL AUDIO DATA | L CHANNEL AUDIO DATA ×VOLUME VALUE | L CHANNEL AUDIO DATA | L CHANNEL AUDIO DATA ×VOLUME VALUE | •••• |
|---|---|---|---|---|---|
| | SUBFRAME 1 | SUBFRAME 2 | SUBFRAME 1 | SUBFRAME 2 | |
| | FRAME N | | FRAME N+1 | | |

FIG. 4

| R CHANNEL | R CHANNEL AUDIO DATA | R CHANNEL VOLUME VALUE | R CHANNEL AUDIO DATA | R CHANNEL VOLUME VALUE | •••• |
|---|---|---|---|---|---|
| | SUBFRAME 1 | SUBFRAME 2 | SUBFRAME 1 | SUBFRAME 2 | |
| | FRAME N | | FRAME N+1 | | |

FIG. 5

| L CHANNEL | L CHANNEL AUDIO DATA | L CHANNEL VOLUME VALUE | L CHANNEL AUDIO DATA | L CHANNEL VOLUME VALUE | •••• |
|---|---|---|---|---|---|
| | SUBFRAME 1 | SUBFRAME 2 | SUBFRAME 1 | SUBFRAME 2 | |
| | FRAME N | | FRAME N+1 | | |

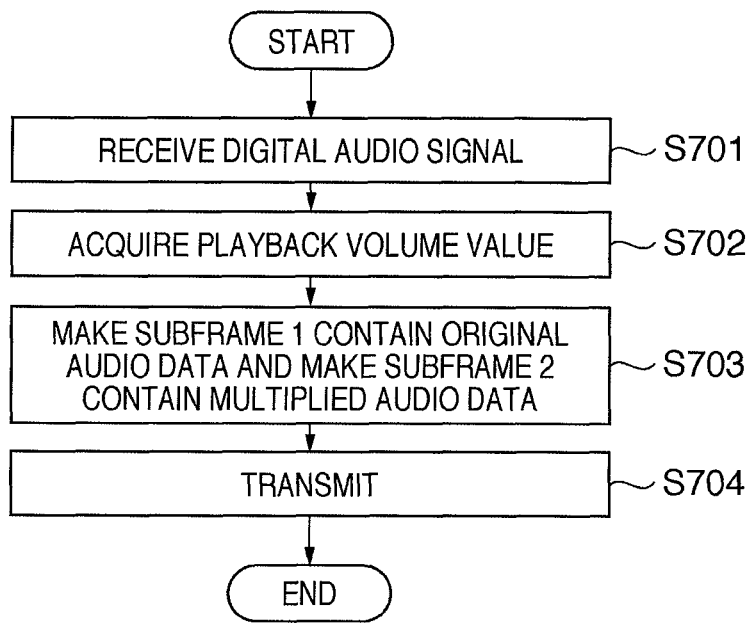
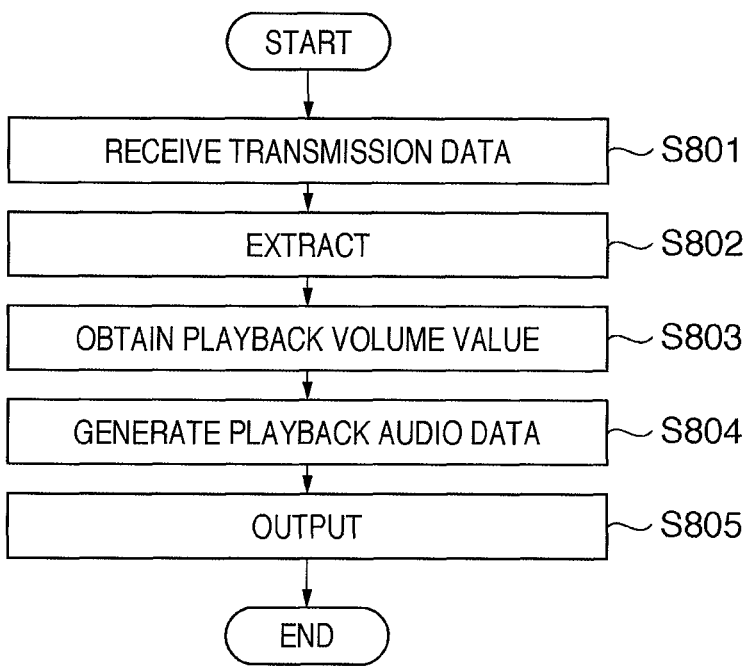

TRANSMISSION APPARATUS AND TRANSMISSION METHOD

BACKGROUND OF THE INVENTION

1. Field of the Invention

The present invention relates to an audio data transmission technique.

2. Description of the Related Art

Progress of digital technologies is leading to development of various techniques of transmitting video and audio information as digital values. For example, a standard called S/PDIF is becoming popular as a major technique of transmitting an audio signal as a digital signal. This technique is used as an interface to connect an audio playback device such as a CD player to a reception device such as an audio amplifier.

Examine a volume adjustment method when outputting sound. According to a common method, audio data of each channel is transmitted by S/PDIF first. Volume is then adjusted and output on the side of the reception device such as an audio amplifier. In this case, a dial or a remote controller for volume adjustment is prepared on the side of the reception device such as an audio amplifier to make the user adjust volume.

However, certain kinds of audio system configurations require volume adjustment on the transmission device side. In this case, a dial or a remote controller for volume adjustment is prepared on the side of the transmission device to cause the user to adjust volume. Data having a value corresponding to original audio data multiplied by the volume value is transmitted by S/PDIF. The receiving side handles it as data containing the volume value and directly outputs the data.

To transmit the volume value on the transmission device side, for example, a technique disclosed in patent reference (Japanese Patent No. 3085931) is used. The technique disclosed in the patent reference transmits volume data embedded in part of transmission data.

When the method of transmitting data which has a value corresponding to original audio data multiplied by the volume value is used to transmit volume information from the transmission device side, the value obtained by multiplication becomes small as the volume value decreases, resulting in poor S/N ratio.

In the method of transmitting volume data embedded in part of transmission data, one volume value is transmitted using a plurality of frames that are transmission units. For this reason, transmission takes time, and the response delays.

SUMMARY OF THE INVENTION

The present invention has been made in consideration of the above-described problems, and provides a technique of implementing audio data transmission with a high S/N ratio and quick response when the transmitting side transmits audio data and its volume value.

According to the first aspect of the present invention, a transmission apparatus, comprises:

an acquisition unit which acquires a playback volume value of audio data of a frame of interest;

a unit which generates multiplied audio data by multiplying the audio data of the frame of interest by the playback volume value; and a transmission unit which transmits the audio data of the frame of interest and the multiplied audio data as transmission data of the frame of interest.

According to the second aspect of the present invention, a transmission method, comprises:

an acquisition step of acquiring a playback volume value of audio data of a frame of interest;

a step of generating multiplied audio data by multiplying the audio data of the frame of interest by the playback volume value; and a transmission step of transmitting the audio data of the frame of interest and the multiplied audio data as transmission data of the frame of interest.

Further features of the present invention will become apparent from the following description of exemplary embodiments with reference to the attached drawings.

BRIEF DESCRIPTION OF THE DRAWINGS

FIG. 2 is a view showing an example of the format of data to be transmitted to an R channel speaker unit 6;

FIG. 3 is a view showing an example of the format of data to be transmitted to an L channel speaker unit 11;

FIG. 4 is a view showing an example of the format of data to be transmitted to an R channel speaker unit 6;

FIG. 5 is a view showing an example of the format of data to be transmitted to an L channel speaker unit 11;

FIG. 7 is a flowchart of processing to be executed by a transmission apparatus 1 to transmit transmission data; and FIG. 8 is a flowchart of processing to be executed by the R channel speaker unit 6 to output sound based on the transmission data.

DESCRIPTION OF THE EMBODIMENTS

The embodiments of the present invention will now be described in detail with reference to the accompanying drawings. Note that the embodiments will be explained as merely examples of the arrangement of the present invention described in the appended claims, and the present invention is not limited by the embodiments to be described below.

[First Embodiment]

Figure 1:
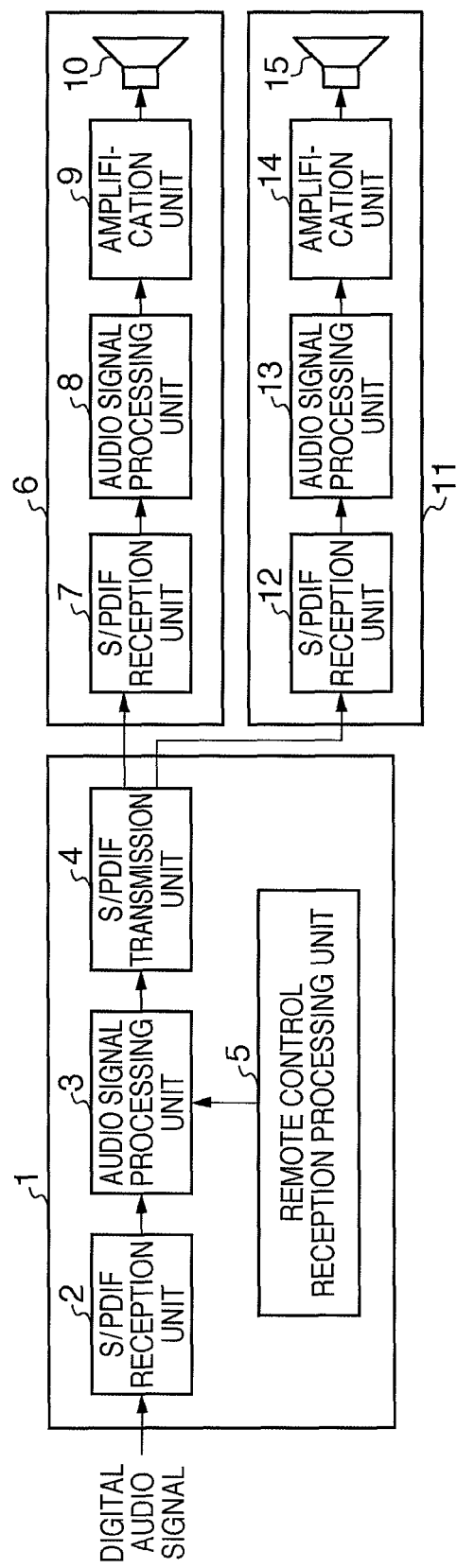
FIG. 1 is a block diagram showing an example of a system configuration for causing a transmission apparatus to transmit audio data to a reception apparatus as a signal.

FIG. 1 is a block diagram showing an example of a system configuration for causing a transmission apparatus to transmit audio data to a reception apparatus as a signal. As shown in FIG. 1, the system includes a transmission apparatus 1, and an R channel speaker unit 6 and an L channel speaker unit 11 each serving as a reception apparatus. The transmission apparatus 1, R channel speaker unit 6, and L channel speaker unit 11 are connected by wires. The transmission apparatus 1 can transmit data to the R channel speaker unit 6 and the L channel speaker unit 11. Note that the transmission apparatus 1, R channel speaker unit 6, and L channel speaker unit 11 may be configured to perform wireless data communication. All units shown in FIG. 1 will be explained as hardware. However, some functions may be implemented by software.

The transmission apparatus 1 will be described first.

The transmission apparatus 1 includes an S/PDIF reception unit 2, audio signal processing unit 3, remote control reception processing unit 5, and S/PDIF transmission unit 4.

The S/PDIF reception unit 2 receives a digital audio signal output from an audio playback device such as a CD player. The S/PDIF reception unit 2 decodes the received digital audio signal and inputs the decoding result to the audio signal processing unit 3 as audio data.

The audio signal processing unit 3 includes a circuit for performing various kinds of acoustic adjustments including sound quality adjustment such as high- and low-frequency output level adjustment and acoustic output correction such as sound field correction. Hence, the audio signal processing unit 3 causes the circuit to generate processed audio data based on the audio data of each frame input from the S/PDIF reception unit 2. For each frame, original audio data and processed audio data generated by the circuit based on the original audio data are generated.

This system includes a remote controller (not shown). The user adjusts the sound quality or uses the acoustic correction function by operating the remote controller. The remote control reception processing unit 5 receives an input command from the remote controller. The remote control reception processing unit 5 decodes the received input command and transmits the decoded command to the audio signal processing unit 3.

In accordance with the command received from the remote control reception processing unit 5, the audio signal processing unit 3 performs various kinds of processing for the audio data input from the S/PDIF reception unit 2. One of adjustment items of the remote controller is volume. When the user adjusts (sets) the volume level by operating the remote controller, a command containing the volume value set by the adjustment is input to the remote control reception processing unit 5. The remote control reception processing unit 5 decodes the command and notifies the audio signal processing unit 3 of the result. The audio signal processing unit 3 updates the current volume value based on the notification. More specifically, the current volume value is updated to the volume value the user has designated using the remote controller.

Hence, for the audio data of each frame input from the S/PDIF reception unit 2, the audio signal processing unit 3 generates (calculates) multiplied audio data by multiplying the audio data by the playback volume value. "Multiplying audio data by a playback volume value" means multiplying each data value in audio data by a playback volume value.

For each frame, the audio signal processing unit 3 sends, to the S/PDIF transmission unit 4, the original audio data and the multiplied audio data obtained by multiplying the original audio data by the playback volume value.

The S/PDIF transmission unit 4 encodes the data received from the audio signal processing unit 3 into data of the S/PDIF format and transmits it to the R channel speaker unit 6 and the L channel speaker unit 11.

FIG. 2 is a view showing an example of the format of data to be transmitted to the R channel speaker unit 6. The S/PDIF transmission unit 4 transmits data in units of "subframe". In this embodiment, subframe 1 and subframe 2 form one frame.

Subframe 1 contains audio data (20 bits) corresponding to the R channel speaker unit 6.

Subframe 2 contains multiplied audio data generated by multiplying the audio data contained in subframe 1 by the volume value updated by the audio signal processing unit 3. Hence, the S/PDIF transmission unit 4 transmits a set of audio data and multiplied audio data to the R channel speaker unit 6 as the transmission data of one frame.

FIG. 3 is a view showing an example of the format of data to be transmitted to the L channel speaker unit 11. Subframe 1 contains audio data (20 bits) corresponding to the L channel speaker unit 11. Subframe 2 contains multiplied audio data generated by multiplying the audio data contained in subframe 1 by the volume value updated by the audio signal processing unit 3. Hence, the S/PDIF transmission unit 4 transmits a set of audio data and multiplied audio data to the L channel speaker unit 11 as the transmission data of one frame.

In this way, a set of audio data and multiplied audio data is transmitted to both speaker units as the transmission data of one frame. The transmission data are sequentially transmitted for the respective frames.

In other words, upon acquiring the playback volume value of audio data of a frame of interest, the transmission apparatus 1 multiplies the audio data of the frame of interest by the playback volume value, thereby generating multiplied audio data. The transmission apparatus 1 transmits the audio data of the frame of interest and the multiplied audio data as the transmission data of the frame of interest.

FIG. 7 is a flowchart of processing to be executed by the transmission apparatus 1 to transmit transmission data.

In step S701, the S/PDIF reception unit 2 receives a digital audio signal output from an audio playback device, decodes the received digital audio signal, and outputs the decoding result to the audio signal processing unit 3 as audio data.

In step S702, the audio signal processing unit 3 updates the current volume value based on a playback volume value acquired from the remote control reception processing unit 5.

In step S703, for the audio data of each frame input from the S/PDIF reception unit 2, the audio signal processing unit 3 generates multiplied audio data by multiplying the audio data by the playback volume value. For each frame, the audio signal processing unit 3 then sends, to the S/PDIF transmission unit 4, the original audio data and the multiplied audio data generated by multiplying the original audio data by the playback volume value.

The S/PDIF transmission unit 4 makes subframe 1 contain the original audio data and subframe 2 contain the multiplied audio data, thereby generating, for each frame, the transmission data of a frame including subframe 1 and subframe 2. This processing is performed for each of the R channel speaker unit 6 and the L channel speaker unit 11.

In step S704, the S/PDIF transmission unit 4 transmits the transmission data of each frame to the R channel speaker unit 6 and the L channel speaker unit 11.

The R channel speaker unit 6 will be described next. The R channel speaker unit 6 includes an S/PDIF reception unit 7, audio signal processing unit 8, amplification unit 9, and speaker 10.

The S/PDIF reception unit 7 receives the transmission data transmitted from the S/PDIF transmission unit 4, decodes the transmission data, and sends the decoding result to the audio signal processing unit 8.

The audio signal processing unit 8 extracts the original audio data (audio data contained in subframe 1) and multiplied audio data (multiplied audio data contained in subframe 2) contained in the decoded transmission data. The audio signal processing unit 8 obtains the playback volume value by dividing the multiplied audio data by the original audio data. More specifically, the audio signal processing unit 8 divides the data value of a representative frame in the multiplied audio data by the data value of a frame corresponding to the representative frame in the original audio data.

The audio signal processing unit 8 multiplies the original audio data extracted from the transmission data by the obtained playback volume value, thereby generating playback audio data. The audio signal processing unit 8 sends the generated playback audio data to the amplification unit 9 of the succeeding stage.

The amplification unit 9 amplifies the level of a signal based on the playback audio data and sends the signal to the speaker 10. Accordingly, the speaker 10 outputs sound based on the playback audio data.

The L channel speaker unit 11 will be described next. The L channel speaker unit 11 includes an S/PDIF reception unit 12, audio signal processing unit 13, amplification unit 14, and speaker 15.

The S/PDIF reception unit 12 receives the transmission data transmitted from the S/PDIF transmission unit 4, decodes the transmission data, and sends the decoding result to the audio signal processing unit 13.

The audio signal processing unit 13 extracts the original audio data (audio data contained in subframe 1) and multiplied audio data (multiplied audio data contained in subframe 2) contained in the decoded transmission data. The audio signal processing unit 13 obtains the playback volume value by dividing the multiplied audio data by the original audio data. The audio signal processing unit 13 multiplies the original audio data extracted from the transmission data by the obtained playback volume value, thereby generating playback audio data. The audio signal processing unit 13 sends the generated playback audio data to the amplification unit 14 of the succeeding stage.

The amplification unit 14 amplifies the level of a signal based on the playback audio data and sends the signal to the speaker 15. Accordingly, the speaker 15 outputs sound based on the playback audio data.

In other words, each of the R channel speaker unit 6 and the L channel speaker unit 11 is a reception apparatus capable of receiving transmission data transmitted from the transmission apparatus 1, and receives the transmission data of each frame from the transmission apparatus 1. Multiplied audio data in the received transmission data of a frame of interest is divided by audio data in the transmission data of the frame of interest to obtain the playback volume value. The audio data in the transmission data of the frame of interest is multiplied by the obtained playback volume value, thereby generating playback audio data of the frame of interest. The frame of interest is played back based on the generated playback audio data.

FIG. 8 is a flowchart of processing to be executed by the R channel speaker unit 6 to output sound based on the transmission data. Note that this processing also applies to the L channel speaker unit 11, as described above.

In step S801, the S/PDIF reception unit 7 receives transmission data transmitted from the S/PDIF transmission unit 4, decodes the transmission data, and sends the decoding result to the audio signal processing unit 8.

In step S802, the audio signal processing unit 8 extracts audio data and multiplied audio data contained in the decoded transmission data.

In step S803, the audio signal processing unit 8 obtains the playback volume value by dividing the multiplied audio data by the audio data.

In step S804, the audio signal processing unit 8 multiplies, by the obtained playback volume value, the audio data extracted from the transmission data, thereby generating playback audio data.

In step S805, the audio signal processing unit 8 sends the generated playback audio data to the amplification unit 9 of the succeeding stage. The amplification unit 9 amplifies the level of a signal based on the playback audio data and sends the signal to the speaker 10. Accordingly, the speaker 10 outputs sound based on the playback audio data.

As described above, according to this embodiment, the playback volume value is calculated based on original audio data. This can make the output signal more accurate and improve the S/N ratio.

[Second Embodiment]

In the first embodiment, subframe 2 contains a result obtained by multiplying original audio data by a playback volume value. However, in the second embodiment, subframe 2 contains a playback volume value acquired from a remote control reception processing unit 5.

FIG. 4 is a view showing an example of the format of data to be transmitted to an R channel speaker unit 6. Subframe 1 contains audio data (20 bits) corresponding to the R channel speaker unit 6. Subframe 2 contains a volume value updated by an audio signal processing unit 3. Hence, an S/PDIF transmission unit 4 transmits a set of audio data and a playback volume value to the R channel speaker unit 6 as the transmission data of one frame.

FIG. 5 is a view showing an example of the format of data to be transmitted to an L channel speaker unit 11. Subframe 1 contains audio data (20 bits) corresponding to the L channel speaker unit 11. Subframe 2 contains a volume value updated by the audio signal processing unit 3. Hence, the S/PDIF transmission unit 4 transmits a set of audio data and a playback volume value to the L channel speaker unit 11 as the transmission data of one frame.

In this way, a set of audio data and a playback volume value is transmitted to both speaker units as the transmission data of one frame. The transmission data are sequentially transmitted for the respective frames.

On the side of the R channel speaker unit 6, an S/PDIF reception unit 7 extracts the playback volume value and original audio data from the transmission data. An audio signal processing unit 8 multiplies the extracted data to generate multiplied audio data. The audio signal processing unit 8 then sends the generated multiplied audio data to an amplification unit 9 of the succeeding stage. This also applies to the L channel speaker unit 11.

The remainders are the same as in the first embodiment.

[Third Embodiment]

In the third embodiment, processing of an R channel speaker unit 6 (L channel speaker unit 11) is different from that in the second embodiment in the following points. That is, the third embodiment is the same as the second embodiment except the following points. Note that the R channel speaker unit 6 will be explained below. The description to be made below also applies to the L channel speaker unit 11.

Every time a playback volume value is extracted from transmission data, an audio signal processing unit 8 in the R channel speaker unit 6 stores it in a memory managed by itself. Hence, the memory stores the playback volume values of a plurality of past frames.

In the second embodiment, original audio data extracted from a frame of interest is multiplied by a playback volume value extracted from the frame of interest. In the third embodiment, the playback volume value of the frame of interest is newly calculated based on the playback volume values of a plurality of past frames stored in the memory. For example, the average value of the playback volume values of k past frames from the frame of interest is calculated as the playback volume value of the frame of interest. The audio data of the frame of interest is multiplied by the playback volume value, thereby generating the playback audio data of the frame of interest. Note that although the average is calculated here, how to use the playback volume values of the k past frames to obtain the playback volume value of the frame of interest is not particularly limited. For example, a weight to be added to each past playback volume value may be set to be smaller in reverse chronological order, and the sum of the weighting results may be obtained as the playback volume value of the frame of interest.

The value "k" used here is decided in consideration of, for example, the response of an output to a change in the playback volume value or an increase in the accuracy for a smaller number of bits of the playback volume value. For example, adaptive control may be done by, e.g., increasing k when the number of bits of the playback volume value is small.

As described above, it is possible to increase the accuracy and improve the S/N ratio by temporally smoothing the playback volume values.

[Fourth Embodiment]

In the fourth embodiment, processing of an R channel speaker unit 6 (L channel speaker unit 11) is different from that in the second embodiment in the following points. That is, the fourth embodiment is the same as the second embodiment except the following points. Note that the R channel speaker unit 6 will be explained below. The description to be made below also applies to the L channel speaker unit 11.

An audio signal processing unit 8 determines whether the value (representative value in data) of original audio data in subframe 1 is equal to or larger than the value (representative value in data) of data in subframe 2. The audio signal processing unit 8 executes the determination for each frame. Upon determining, continuously for N or more frames, that the value of original audio data in subframe 1 is equal to or larger than the value of data in subframe 2, the audio signal processing unit 8 determines that subframe 2 contains multiplied audio data. In this case, the R channel speaker unit 6 performs the same processing as in the first embodiment.

On the other hand, if it is not determined, continuously for N or more frames, that the value of original audio data in subframe 1 is equal to or larger than the value of data in subframe 2, the audio signal processing unit 8 determines that subframe 2 contains a playback volume value. In this case, the R channel speaker unit 6 performs the same processing as in the second or third embodiment.

Note that in the latter case, it may be determined that, for example, subframe 1 contains R channel audio data, and subframe 2 contains L channel audio data, and processing of causing the user to select data to be output may be executed.

As described above, according to this embodiment, processing can be switched by automatically discriminating between a unique protocol and another general-purpose protocol.

[Fifth Embodiment]

Figure 6:
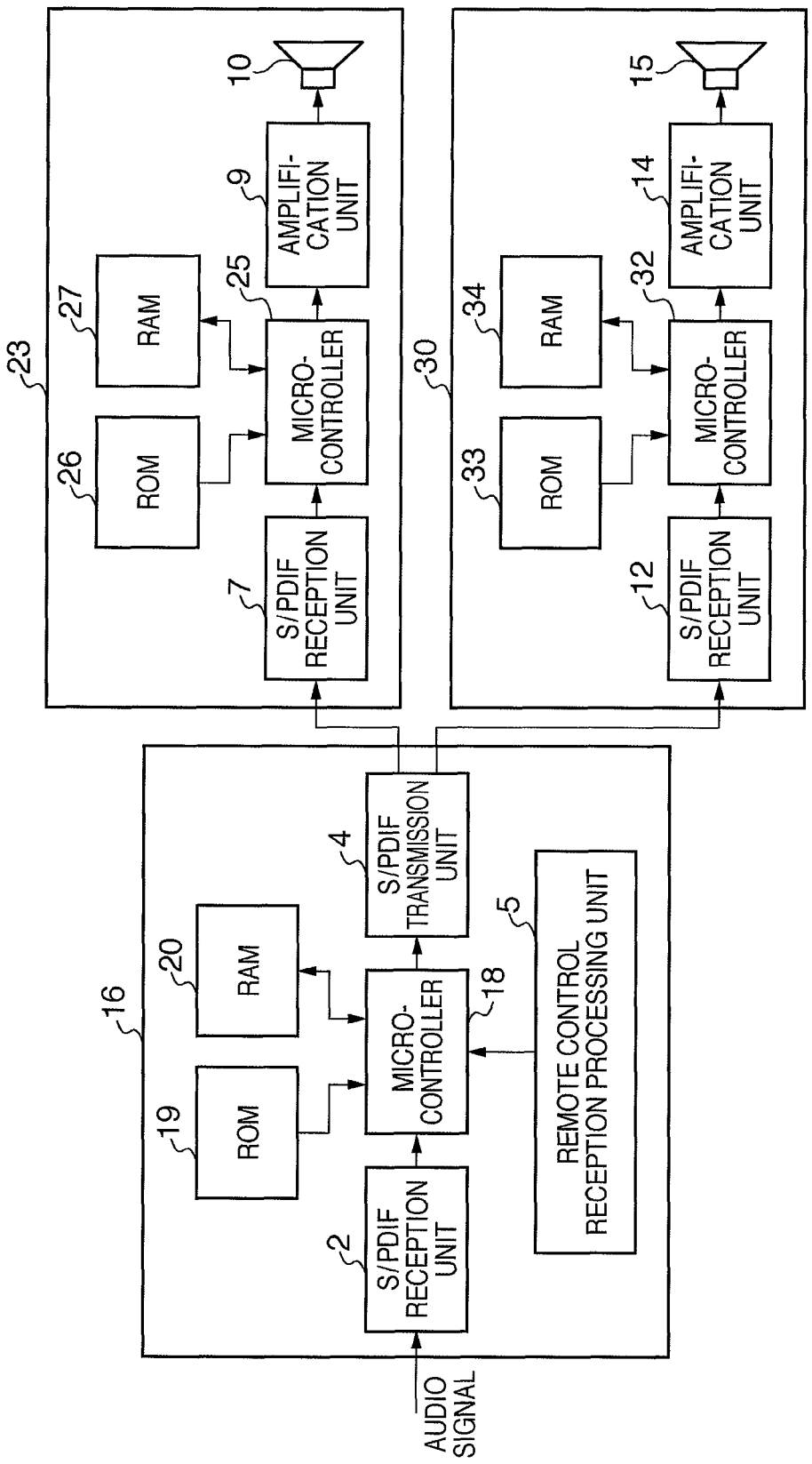
FIG. 6 is a block diagram showing an example of a system configuration for causing a transmission apparatus to transmit audio data to a reception apparatus as a signal.

FIG. 6 is a block diagram showing an example of a system configuration for causing a transmission apparatus to transmit audio data to a reception apparatus as a signal. As shown in FIG. 6, the system includes a transmission apparatus 16, and an R channel speaker unit 23 and an L channel speaker unit 30 each serving as a reception apparatus. The transmission apparatus 16, R channel speaker unit 23, and L channel speaker unit 30 are connected by wires. The transmission apparatus 16 can transmit data to the R channel speaker unit 23 and the L channel speaker unit 30. Note that the transmission apparatus 16, R channel speaker unit 23, and L channel speaker unit 30 may be configured to perform wireless data communication. All units shown in FIG. 6 will be explained as hardware. However, some functions may be implemented by software.

In the arrangement shown in FIG. 6, the audio signal processing unit 3 of the arrangement shown in FIG. 1 is constituted by a microcontroller 18, ROM 19, and RAM 20. The audio signal processing unit 8 is constituted by a microcontroller 25, ROM 26, and RAM 27. The audio signal processing unit 13 is constituted by a microcontroller 32, ROM 33, and RAM 34.

More specifically, the ROM 19 stores computer programs and data to be used to cause the microcontroller 18 to execute the above-described processing of the audio signal processing unit 3. The microcontroller 18 executes processing using the computer programs and data, thereby executing the above-described processing of the audio signal processing unit 3. At this time, the RAM 20 can temporarily store data.

The ROM 26 stores computer programs and data to be used to cause the microcontroller 25 to execute the above-described processing of the audio signal processing unit 8. The microcontroller 25 executes processing using the computer programs and data, thereby executing the above-described processing of the audio signal processing unit 8. At this time, the RAM 27 can temporarily store data.

The ROM 33 stores computer programs and data to be used to cause the microcontroller 32 to execute the above-described processing of the audio signal processing unit 13. The microcontroller 32 executes processing using the computer programs and data, thereby executing the above-described processing of the audio signal processing unit 13. At this time, the RAM 34 can temporarily store data.

According to the above-described embodiments, the following effects can be obtained.

First, since an output signal is calculated based on original audio data, the output signal can be made more accurate, and the S/N ratio can be improved. It is also possible to increase the accuracy by temporally smoothing playback volume values.

In addition, since a playback volume value is transmitted for each frame, the speed of reflecting volume on output sound increases as compared to the conventional method of transmitting one piece of volume information using a plurality of frames. This is especially advantageous when, for example, varying volume in real time.

There is, for example, a technique called dynamic range compression. This technique decreases volume to prevent the sound output level from rising when the data value of audio data is large, or increases volume to make sound easy to listen when the data value of audio data is small. This processing requires quick response of volume control. Hence, in this case, the above-described embodiments effectively function.

The above-described embodiments can also implement various kinds of conventional methods including the method of outputting sound after adjusting volume on the receiving side using only original audio data, and the method of directly outputting sound using only multiplied audio data. For example, a reception device such as a general-purpose audio amplifier can also be connected and used. That is, it is possible to support various systems without changing the protocol.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-011118 filed Jan. 21, 2009, which is hereby incorporated by reference herein in its entirety.

What is claimed is:

1. A transmission apparatus, comprising:
an acquisition unit which acquires a playback volume value of audio data of a frame of interest;
a generating unit which generates multiplied audio data by multiplying the audio data of the frame of interest by the playback volume value; and
a transmission unit which transmits, as transmission data of the frame of interest, a set which includes both the audio data of the frame of interest and the multiplied audio data generated from the audio data of the frame of interest by the generating unit,
wherein the transmission unit transmits the audio data of the frame of interest and the multiplied audio data as the transmission data of the frame of interest to a playback side,
wherein the playback side receives the transmission data of the frame of interest, derives a play back volume value from the audio data of the frame of interest and the multiplied audio data, multiplies the derived play back volume value with the audio data of the frame of interest, and plays back the audio data of the frame of interest multiplied with the derived play back volume value.

2. The apparatus according to claim 1, wherein said acquisition unit acquires the playback volume value by receiving, from a remote controller, the playback volume value set in the remote controller operated by a user.

3. A transmission method executed by a transmission apparatus, comprising:
an acquisition step of acquiring a playback volume value of audio data of a frame of interest;
a generating step of generating multiplied audio data by multiplying the audio data of the frame of interest by the playback volume value; and
a transmission step of transmitting, as transmission data of the frame of interest, a set which includes both the audio data of the frame of interest and the multiplied audio data generated from the audio data of the frame of interest by the generating step,
wherein the transmission step transmits the audio data of the frame of interest and the multiplied audio data as the transmission data of the frame of interest to a playback side,
wherein the playback side receives the transmission data of the frame of interest, derives a play back volume value from the audio data of the frame of interest and the multiplied audio data, multiplies the derived play back volume value with the audio data of the frame of interest, and plays back the audio data of the frame of interest multiplied with the derived play back volume value.

* * * * *